US007919903B2

(12) United States Patent
Hong et al.

(10) Patent No.: US 7,919,903 B2
(45) Date of Patent: Apr. 5, 2011

(54) MEMS SWITCH

(75) Inventors: Young-tack Hong, Suwon-si (KR); Dong-kyun Kim, Suwon-si (KR); In-sang Song, Seoul (KR); Sang-hun Lee, Seoul (KR); Sang-wook Kwon, Seongnam-si (KR); Jong-seok Kim, Hwaseong-si (KR); Che-heung Kim, Yongin-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 970 days.

(21) Appl. No.: 11/540,655

(22) Filed: Oct. 2, 2006

(65) Prior Publication Data

US 2007/0159510 A1 Jul. 12, 2007

(30) Foreign Application Priority Data

Jan. 10, 2006 (KR) ........................ 10-2006-0002643

(51) Int. Cl.
*H01L 41/00* (2006.01)

(52) U.S. Cl. ........ 310/328; 310/330; 310/332; 310/333; 333/262

(58) Field of Classification Search .................. 310/328, 310/330, 331, 332
See application file for complete search history.

(56) References Cited

U.S. PATENT DOCUMENTS

| | | | | |
|---|---|---|---|---|
| 5,905,241 | A * | 5/1999 | Park et al. | 200/409 |
| 6,924,966 | B2 | 8/2005 | Prophet | |
| 7,109,641 | B2 | 9/2006 | Park | |
| 7,122,942 | B2 * | 10/2006 | Song et al. | 310/328 |
| 7,151,425 | B2 * | 12/2006 | Park et al. | 333/262 |
| 2004/0211654 | A1 * | 10/2004 | Park | 200/10 |
| 2006/0087716 | A1 * | 4/2006 | Kweon et al. | 359/290 |
| 2007/0122074 | A1 * | 5/2007 | Kim et al. | 385/16 |
| 2008/0060919 | A1 * | 3/2008 | Nakanishi | 200/181 |

FOREIGN PATENT DOCUMENTS

| | | | |
|---|---|---|---|
| CN | 1540700 | A | 10/2004 |
| JP | 2001076605 | A | 3/2001 |
| JP | 2004-327441 | A | 11/2004 |
| JP | 2005527963 | A | 9/2005 |

* cited by examiner

*Primary Examiner* — Walter Benson
*Assistant Examiner* — Bryan P Gordon
(74) *Attorney, Agent, or Firm* — Sughrue Mion, PLLC

(57) ABSTRACT

A Micro Electro Mechanical System (MEMS) switch includes a substrate, a fixed signal line formed on the substrate, a movable signal line spaced apart from one of an upper surface and a lower surface of the fixed signal line, and at least one piezoelectric actuator connected to a first end of the movable signal line so as to bring or separate the movable signal line in contact with or from the fixed signal line. The piezoelectric actuator includes a first electrode, a piezoelectric layer formed on the first electrode, a second electrode formed on the piezoelectric layer, and a connecting layer formed on the second electrode and connected with the movable signal line.

11 Claims, 3 Drawing Sheets

MEMS SWITCH

This application claims priority under 35 U.S.C. §119 (a) from Korean Patent Application No. 10-2006-02643 filed on Jan. 10, 2006 in the Korean Intellectual Property Office, the disclosure of which is incorporated herein by reference.

BACKGROUND OF THE INVENTION

1. Field of the Invention

An apparatus consistent with the present invention relates to a MEMS (Micro Electro Mechanical System) switch, such as an RF (Radio Frequency) switch, fabricated using a MEMS technique and, in particular, to a MEMS switch which is driven by using a piezoelectric element or actuator.

2. Description of the Related Art

Among RF elements using the MEMS technique, an RF switch is most widely fabricated. The RF switch is an element, which is used often in an impedance matching circuit or for selectively transmitting a signal, in wireless communication terminals and systems of microwave or millimeter wave band.

FIG. 1 is a top plan view exemplifying a structure of a conventional MEMS switch, and FIG. 2 is a cross-sectional view taken along line II-II' of FIG. 1.

Referring to FIGS. 1 and 2, a signal line 3, which has contacts 3*a* spaced apart from each other by a predetermined distance, is formed on the middle of an upper surface of a substrate 2. Above the contacts 3*a* is located a movable electrode 6, which is supported by anchors 5. A contact member 6*a* is formed at the middle of the movable electrode 6 to connect the contacts 3*a* with each other.

A fixed electrode 7 is formed on the substrate 2 at both sides of the signal line 3, so that it generates an electrostatic force along with the movable electrode 6 therebetween and thus pulls and brings the contact member 6*a* of the movable electrode 6 in contact with the contacts 3*a*.

According to the conventional MEMS switch constructed as described above, when a DC voltage is applied to the fixed electrode 7, the movable electrode 6 is charged with electricity, and thereby electrostatic force is produced between the movable electrode 6 and the fixed electrode 7. As a result, the movable electrode 6 is pulled toward the substrate 2. With the movable electrode 6 being pulled, both side portions of the contact member 6*a*, which is formed on the middle of the movable electrode 6, are placed in contact with the contacts 3*a* of the signal line 3.

However, the conventional MEMS switch has a structure in that both side portions of the contact member 6*a* are placed into contact with the contacts 3*a* of the signal line 3 during the operation. Such a structure not only increases the contact resistance, but also the insertion loss according thereto.

SUMMARY OF THE INVENTION

Exemplary embodiments of the present invention address the above problems and/or disadvantages and provide at least the advantages described below. Accordingly, an aspect of the present invention is to provide a MEMS switch, which has an improved contact structure for signal lines, thereby reducing the contact resistance and the insertion loss according thereto.

Another aspect of the present invention is to provide a MEMS switch, which can be driven with a low voltage.

Additional aspects and advantages of the invention will be set forth in part in the description which follows and, in part, will be apparent from the description, or may be learned by practice of the invention.

According to one aspect of an exemplary embodiment of the present invention, there is provided a MEMS switch comprising a substrate, a fixed signal line formed on the substrate, a movable signal line spaced apart from an upper surface of the fixed signal line, and at least one piezoelectric actuator connected to a first end of the movable signal line so as to bring or separate the movable signal line in contact with or from the fixed signal line.

The at least one piezoelectric actuator may comprise a first electrode, a piezoelectric layer formed on the first electrode, a second electrode formed on the piezoelectric layer, and a connecting layer formed on the second electrode and connected with the movable signal line.

The at least one piezoelectric actuator may comprise a first end having a supporting part supported on the substrate, and a free end connected to the movable signal line.

The first and the second electrodes may be formed of a material selected from Al, Au, Pt, W, Mo, Ta, Pt—Ta, Ti and Pt—Ti, respectively.

The piezoelectric layer may be formed of a material selected from PZT, PLZT, ZnO, PMN, PMN—PT, PZN, PZN—PT and AlN.

The connecting layer may be formed of a material selected from $Si_XN_Y$ and AlN.

The at least one piezoelectric actuator may comprise two piezoelectric actuators arranged at opposite sides of the movable signal line.

Connecting layers of the two piezoelectric actuators may be connected in common with each other so as to interconnect the two piezoelectric actuators.

The movable signal line may comprise a supporting part supported on the substrate.

According to another aspect of an exemplary embodiment of the present invention, there is provided a MEMS switch comprising a substrate, a fixed signal line spaced apart from an upper surface of the substrate, a movable signal line spaced apart from the upper surface of the substrate and from a lower surface of the fixed signal line, and at least one piezoelectric actuator connected to a first end of the movable signal line so as to bring or separate the movable signal line in contact with or from the fixed signal line.

The at least one piezoelectric actuator may comprise a first electrode, a piezoelectric layer formed under the first electrode, a second electrode formed under the piezoelectric layer, and a connecting layer formed under the second electrode and connected with the movable signal line.

The at least one piezoelectric actuator may comprise a first end having a supporting part supported on the substrate, and a free end connected to the movable signal line.

The first and the second electrodes may be formed of a material selected from Al, Au, Pt, W, Mo, Ta, Pt—Ta, Ti and Pt—Ti, respectively.

The piezoelectric layer may be formed of a material selected from PZT, PLZT, ZnO, PMN, PMN—PT, PZN, PZN—PT and AlN.

The connecting layer may be formed of a material selected from $Si_XN_Y$ and AlN.

The at least one piezoelectric actuator may comprise two piezoelectric actuators arranged at opposite sides of the movable signal line.

Connecting layers of the two piezoelectric actuators may be connected in common with each other so as to interconnect the two piezoelectric actuators.

The movable signal line may comprise a line supporting part supported on the substrate.

Other objects, advantages, and salient features of the invention will become apparent to those skilled in the art from the following detailed description, which, taken in conjunction with the annexed drawings, discloses exemplary embodiments of the invention.

BRIEF DESCRIPTION OF THE DRAWINGS

The above aspects and features of the present invention will be more apparent from the description for exemplary embodiments of the present invention taken with reference to the accompanying drawings, in which.

Throughout the drawings, the same drawing reference numerals will be understood to refer to the same elements, features, and structures.

DETAILED DESCRIPTION OF ILLUSTRATIVE, NON-LIMITING EMBODIMENTS OF THE INVENTION

Figure 1:
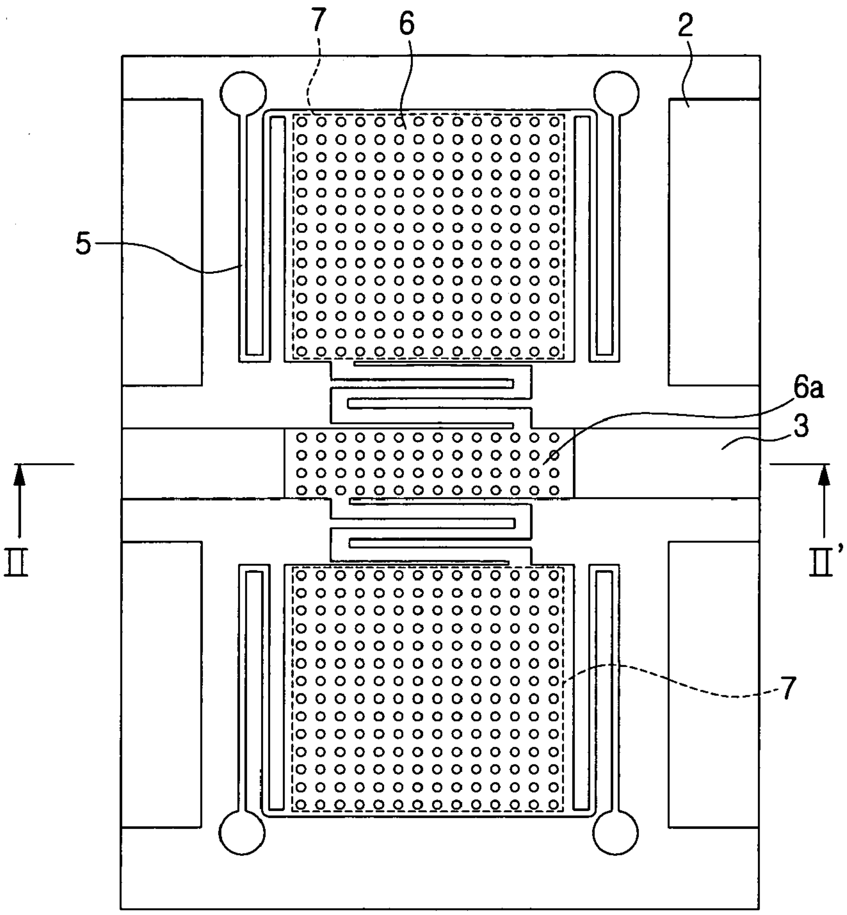
FIG. 1 (PRIOR ART)
FIG. 1 is a top plan view exemplifying a structure of a conventional MEMS switch.
Figure 2:
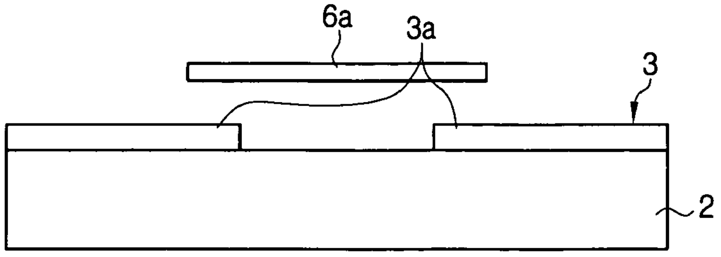
FIG. 2 (PRIOR ART)
FIG. 2 is a cross-sectional view taken along line II-II' of FIG. 1.

Reference will now be made in detail to the embodiments of the present invention, examples of which are illustrated in the accompanying drawings, wherein like reference numerals refer to the like elements throughout. The embodiments are described below in order to explain the present invention by referring to the figures.

Figure 3:
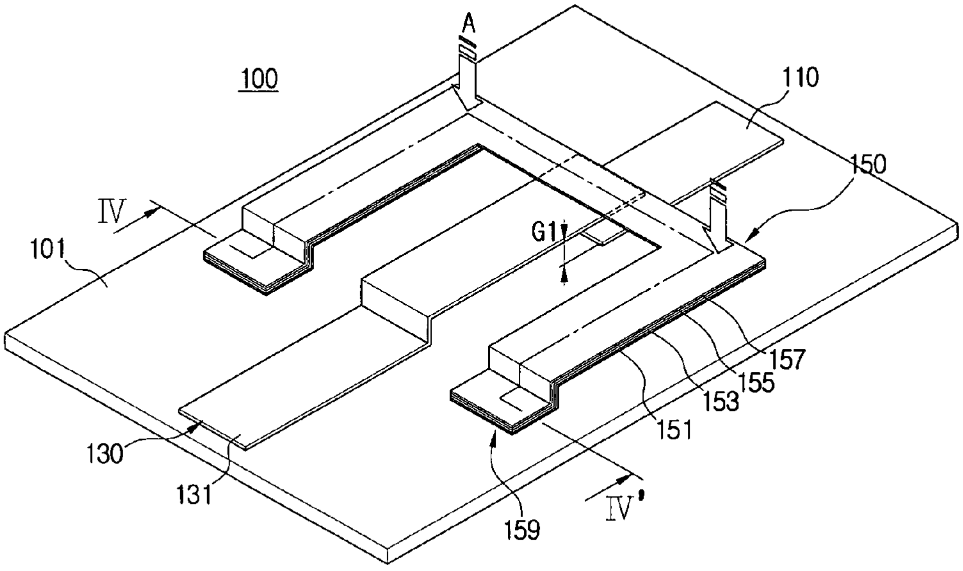
FIG. 3 is a perspective view exemplifying a structure of a MEMS switch in accordance with an exemplary embodiment of the present invention.
Figure 4:
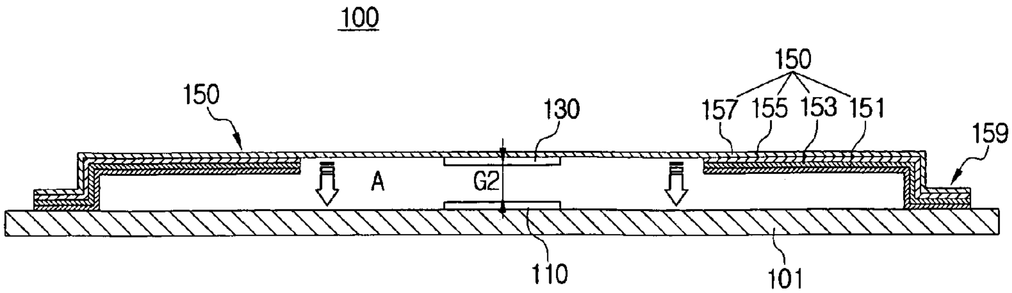
FIG. 4 is a cross-sectional view taken along line IV-IV' of FIG. 3.

FIG. 3 is a perspective view exemplifying a structure of a MEMS switch in accordance with an exemplary embodiment of the present invention, and FIG. 4 is a cross-sectional view taken along line IV-IV' of FIG. 3.

Referring to FIGS. 3 and 4, the MEMS switch 100 in accordance with the exemplary embodiment of the present invention includes a substrate 101, a fixed signal line 110, a movable signal line 130, and a piezoelectric actuator 150.

The fixed signal line 110 is formed at one side on the middle of the substrate 101, and the movable signal line 130 is formed at the other side on the middle of the substrate 101. The movable signal line 130 at a first end, i.e., a free end thereof is spaced apart from an upper surface of the substrate 101 by a predetermined gap Gi, and overlapped with a first end of the fixed signal line 110. A second end of the movable signal line 130, which positioned at an opposite side to the free end thereof corresponding to the first end of the fixed signal line 110, has a line supporting part 131 to cantilever the movable signal line 130 on the substrate 101.

The fixed signal line 110 and the movable signal line 130 are made of a conductive metal such as Au, etc., respectively The piezoelectric actuator 150, which drives the free end of the movable signal line 130 down and thus to bring it in contact with the first end of the fixed signal line 110, includes a first electrode 151, a piezoelectric layer 153 formed on the first electrode 151, a second electrode 155 formed on the piezoelectric layer 153, and a connecting layer 157 formed on the second electrode 155 and connected with an upper surface of the movable signal line 130.

The first and the second electrodes 151 and 155 may be made of Al, Au, Pt, W, Mo, Ta, Pt—Ta, Ti, or Pt—Ti, respectively.

The piezoelectric layer 153 may be made of PZT, PLZT, ZnO, PMN, PMN-PT, PZN-PT, or AlN.

The connecting layer 157 may be made of $Si_XN_Y$ (silicon nitride), or AlN.

The piezoelectric actuator 150 at a first end thereof has an actuator supporting part 159 connected to the substrate 101, so that it is cantilevered on the substrate 101. The piezoelectric actuator 150 at a second end, i.e., a free end thereof is connected to the free end of the movable signal line 130.

As shown in FIGS. 3 and 4, the piezoelectric actuator 150 is preferably, but not necessarily, configured, such that a plurality of, e.g., two piezoelectric actuators, which are disposed at both sides of the movable signal line 130, have the connecting layer 157 in common, and thereby they are interconnected by it. However, the piezoelectric actuator 150 can be configured to have a single piezoelectric actuator structure, instead of having the plurality of piezoelectric actuators connected by the connecting layer 157.

Hereinafter, an operation of the MEMS switch 100 in accordance with the exemplary embodiment of the present invention constructed as described above will now be described in detail.

First, when a predetermined level of voltage is applied to the first and the second electrodes 151 and 155, an electric field is produced between the first and the second electrodes 151 and 155. The piezoelectric layer 153, which is formed between the first and the second electrodes 151 and 155, is deformed in a direction vertical to the electric field. At this time, since the connecting layer 157 supports an upper surface of the second electrode 155, the piezoelectric layer 153 is bent in a downward direction (a direction of arrow A).

With the bending of the piezoelectric layer 153 in the downward direction, the movable signal line 130 is lowered and placed into contact with the fixed signal line 110 thus to transmit a signal.

Figure 5:
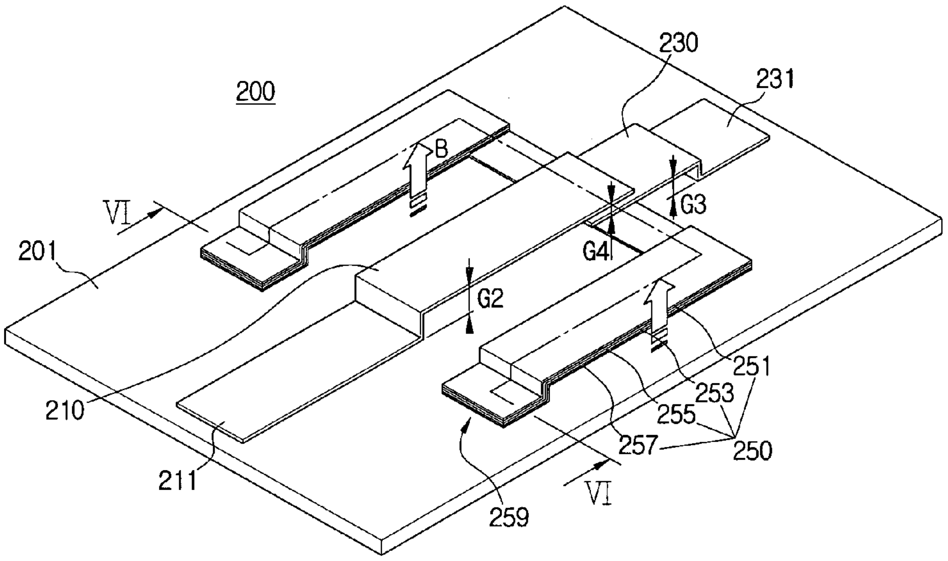
FIG. 5 is a perspective view exemplifying a structure of a MEMS switch in accordance with another exemplary embodiment of the present invention.
Figure 6:
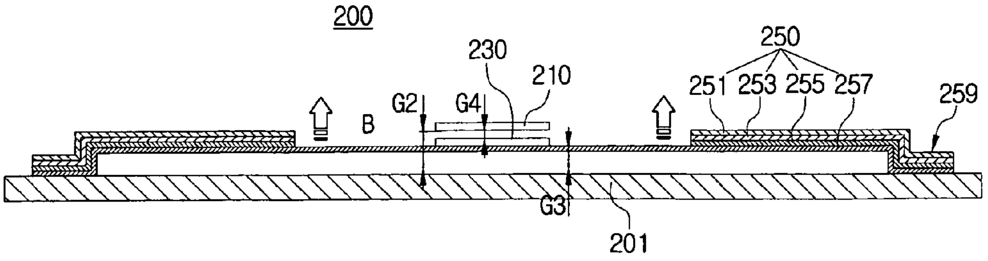
FIG. 6 is a cross-sectional view taken along line VI-VI' of FIG. 5.

FIG. 5 is a perspective view exemplifying a structure of a MEMS switch 200 in accordance with another exemplary embodiment of the present invention, and FIG. 6 is a cross-sectional view taken along line VI-VI' of FIG. 5.

Referring to FIGS. 5 and 6, the MEMS switch 200 in accordance with another exemplary embodiment of the present invention has the same basic structure as that of the MEMS switch 100 shown in FIGS. 3 and 4, except that a piezoelectric actuator 250 is driven in an upward direction (a direction of arrow B) so as to move a movable signal line 230 up and thereby to bring it in contact with a fixed signal line 210.

More specifically, the MEMS switch 200 in accordance with the further exemplary embodiment of the present invention includes the fixed signal line 210, the movable signal line 230, and a piezoelectric actuator 250. The fixed signal line 210 at a first end thereof is spaced apart from an upper surface of a substrate 201 by a predetermined second gap G2. The movable signal line 230 at a first end, i.e., a free end thereof is spaced apart from the upper surface of the substrate 201 by a predetermined third gap G3 and from the lower surface of with the fixed signal line 210 by a predetermined fourth gap G4. The piezoelectric actuator 250 is connected to the free end of the movable signal line 230, so that it can bring or separate the movable signal line 230 in contact with or from the fixed signal line 210.

The fixed signal line 210 has a line supporting part 211 formed on the substrate 201 at a second end thereof, so that it is cantilevered on the substrate 201. The movable signal line 230 also has a line supporting part 231 formed on the substrate 210 at a second end thereof, so that it is cantilevered on the substrate 201.

The piezoelectric actuator includes a first electrode 251, a piezoelectric layer 253 formed under the first electrode 251, a second electrode 255 formed under the piezoelectric layer 253, and a connecting layer 257 formed under the second electrode 255 and connected with the undersurface of the free end of the movable signal line 230.

The piezoelectric actuator 250 has a supporting part 259 formed on the substrate 201 at a first end thereof, so that it is cantilevered on the substrate 201. The piezoelectric actuator 250 is connected to the free end of the movable signal line 230 at a second end, i.e., a free end thereof.

Like the piezoelectric actuator 150 of the MEMS switch 100, the piezoelectric actuator 250 is preferably, but not necessarily, configured, such that a plurality of, e.g., two piezoelectric actuators, which are disposed at both sides of the movable signal line 230,.have the connecting layer 257 in common and thereby they are interconnected by it. However, the piezoelectric actuator 250 can be configured to have a single piezoelectric actuator structure, instead of having the plurality of piezoelectric actuators interconnected by the connecting layer 257.

Since constructions and materials of the respective components of the MEMS switch 200 in accordance with the further exemplary embodiment of the present invention shown in FIGS. 5 and 6 are identical to those of the MEMS switch 100 explained with reference to FIGS. 3 and 4, detailed descriptions and illustrations thereof will be omitted.

Also, operation of the MEMS switch 200 in accordance with the further exemplary embodiment of the present invention shown in FIGS. 5 and 6 is the same as that of the MEMS switch 100 explained with reference to FIGS. 3 and 4, except that the piezoelectric layer 253 is bent in an upward direction (a direction of arrow B) so as to move the movable signal line 230 up. Accordingly, detailed descriptions and illustrations on the operation of the MEMS switch 200 in accordance with the further exemplary embodiment of the present invention thereof will be omitted.

As apparent from the foregoing description, according to the exemplary embodiments of the present invention, the MEMS switches are not driven with the electrostatic driving method, but the piezoelectric driving method. Accordingly, the MEMS switches in accordance with the exemplary embodiments of the present invention can be driven with a low voltage.

Also, according to the exemplary embodiments of the present invention, the piezoelectric MEMS switches are configured, such that the movable signal line has a single contact to be in contact with the fixed signal line, thereby reducing the contact resistance and the insertion loss according thereto.

Although exemplary embodiments of the present invention have been shown and described, it will be appreciated by those skilled in the art that changes may be made in these embodiments without departing from the principles and spirit of the invention, the scope of which is defined in the claims and their equivalents.

What is claimed is:

1. A Micro Electro Mechanical System (MEMS) switch comprising:

a substrate;

a fixed signal line spaced apart from an upper surface of the substrate;

a movable signal line comprising a first portion which is fixed with respect to the substrate, and a second portion which is moveable and is spaced apart from the upper surface of the substrate and from a lower surface of the fixed signal line; and at least one piezoelectric actuator connected to the second portion of the movable signal line so as to bring or separate the second portion of the movable signal line in contact with or from the fixed signal line, wherein the at least one piezoelectric actuator is spaced apart from the upper surface of the substrate and the lower surface of the fixed signal line.

2. The MEMS switch as claimed in claim 1, wherein the at least one piezoelectric actuator comprises:

a first electrode;

a piezoelectric layer formed under the first electrode;

a second electrode formed under the piezoelectric layer; and a connecting layer formed under the second electrode and connected with the second portion of the movable signal line.

3. The MEMS switch as claimed in claim 1, wherein the at least one piezoelectric actuator comprises a first end having a supporting part supported on the substrate, and a free end connected to the second portion of the movable signal line.

4. The MEMS switch as claimed in claim 2, wherein the first and the second electrodes are formed of a material selected from Al, Au, Pt, W, Mo, Ta, Pt—Ta, Ti and Pt—Ti, respectively.

5. The MEMS switch as claimed in claim 2, wherein the piezoelectric layer is formed of a material selected from PZT, PLZT, ZnO, PMN, PMN-PT, PZN, PZN-PT and A1N.

6. The MEMS switch as claimed in claim 2, wherein the connecting layer is formed of a material selected from SiXNY and A1N.

7. The MEMS switch as claimed in claim 2, wherein the at least one piezoelectric actuator comprises two piezoelectric actuators arranged at opposite sides of the second portion of the movable signal line.

8. The MEMS switch as claimed in claim 7, wherein connecting layers of the two piezoelectric actuators are connected in common with each other so as to interconnect the two piezoelectric actuators.

9. The MEMS switch as claimed in claim 2, wherein the first portion of the movable signal line comprises a supporting part supported on the substrate.

10. A Micro Electro Mechanical System (MEMS) switch comprising:

a substrate;

a fixed signal line formed on the substrate;

a movable signal line comprising a first portion which is fixed with respect to the substrate, and a second portion which is moveable and is spaced apart from one of an upper surface and a lower surface of the fixed signal line; and at least one piezoelectric actuator connected to the second portion of the movable signal line so as to bring or separate the movable signal line in contact with or from the fixed signal line;

wherein the at least one piezoelectric actuator is spaced apart from an upper surface of the substrate.

11. The MEMS switch as claimed in claim 1, wherein the at least one piezoelectric actuator brings or separates the second portion of the moveable signal line in contact with or from the fixed signal line.

* * * * *